United States Patent
Liu

(10) Patent No.: US 10,157,821 B1
(45) Date of Patent: Dec. 18, 2018

(54) SEMICONDUCTOR PACKAGES

(71) Applicant: Advanced Semiconductor Engineering, Inc., Kaohsiung (TW)

(72) Inventor: Chao Cheng Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/608,920

(22) Filed: May 30, 2017

(51) Int. Cl.
*H01L 23/488* (2006.01)
*H01L 23/485* (2006.01)
*H01L 23/498* (2006.01)
*H01L 23/00* (2006.01)

(52) U.S. Cl.
CPC .......... *H01L 23/488* (2013.01); *H01L 23/485* (2013.01); *H01L 23/49861* (2013.01); *H01L 24/10* (2013.01); *H01L 2224/13099* (2013.01); *H01L 2224/32225* (2013.01); *H01L 2224/48227* (2013.01)

(58) Field of Classification Search
CPC .......... H01L 24/07; H01L 24/10; H01L 24/15
See application file for complete search history.

(56) References Cited

U.S. PATENT DOCUMENTS

| | | | | |
|---|---|---|---|---|
| 4,914,814 A * | 4/1990 | Behun | .................. | H05K 3/3436 174/263 |
| 5,147,084 A * | 9/1992 | Behun | .................... | G01R 31/04 174/259 |
| 6,433,425 B1 * | 8/2002 | Sarkhel | .................. | H01L 23/488 228/180.22 |
| 6,504,105 B1 * | 1/2003 | Acocella | .............. | B23K 1/0008 174/255 |
| 6,543,674 B2 * | 4/2003 | Lee | ........................ | H01L 21/563 228/164 |
| 2004/0094842 A1 * | 5/2004 | Jimarez | ................ | B23K 1/0016 257/772 |
| 2012/0193778 A1 * | 8/2012 | Mawatari | ............ | H01L 23/3128 257/737 |
| 2012/0252170 A1 * | 10/2012 | Gallegos | ............... | H01L 21/563 438/127 |
| 2013/0127046 A1 * | 5/2013 | Henderson | ........ | H01L 21/67092 257/737 |
| 2015/0162292 A1 * | 6/2015 | Machida | .................. | H01L 24/16 257/737 |
| 2016/0240513 A1 * | 8/2016 | Dang | ...................... | H01L 24/17 |

FOREIGN PATENT DOCUMENTS

| CN | 104979314 A | * 10/2015 |
|---|---|---|
| CN | 104979314 A | 10/2015 |

* cited by examiner

*Primary Examiner* — Sitaramarao S Yechuri
(74) *Attorney, Agent, or Firm* — Foley & Lardner LLP; Cliff Z. Lui

(57) ABSTRACT

A semiconductor package includes: a substrate including a conductive pad; a semiconductor device including a conductive member; and a connection element between the conductive pad and the conductive member, wherein the connection element has a sidewall, and an angle of the sidewall relative to the conductive pad is equal to or less than about 90 degrees.

19 Claims, 25 Drawing Sheets

SEMICONDUCTOR PACKAGES

TECHNICAL FIELD

The present disclosure generally relates to a semiconductor package, and more particularly relates to a semiconductor package including a connection element including a cup or rim portion surrounding a conductive member.

BACKGROUND

A semiconductor package may undergo several thermal cycle(s) during a manufacturing process, for example, a reflow operation (with a peak reflow temperature up to about 240 to about 250 degrees Celsius), a clean operation (at around room temperature), a baking operation, a molding operation (at around 160 degrees Celsius), etc., which may result in relatively greater warpage of the semiconductor package. Moreover, comparable processes for manufacturing semiconductor packages may use a relatively greater number of operations, which may result in relatively higher cost and reduce a units per hour (UPH) of products. Furthermore, during some operation(s) performed at relatively higher temperatures (e.g., the reflow operation), solder/pre-solder is melted into liquid state, and thus bleeding or creeping issues of the melted solder/pre-solder may occur, which adversely affects electrical connection of the semiconductor package. Moreover, as the pitch and width of the semiconductor package gets smaller (e.g., fine-pitch), it would be challenging to treat or clean the semiconductor device and the substrate, especially after the semiconductor device is bonded to the substrate, and plasma or ions may be blocked by solder balls/copper pillars. Accordingly, void(s) and delamination may occur in the molding operation. Therefore, there is a desire for, for example, but not limited to, a semiconductor package that would avoid the problem(s) mentioned above.

SUMMARY

In some embodiments, a semiconductor package includes: a substrate including a conductive pad; a semiconductor device including a conductive member; and a connection element between the conductive pad and the conductive member, wherein the connection element has a sidewall, and an angle of the sidewall relative to the conductive pad is equal to or less than about 90 degrees.

In some embodiments, a semiconductor package includes: a substrate including a conductive pad; a semiconductor device including a conductive member; and a connection element between the conductive pad and the conductive member, wherein the connection element includes a rim portion surrounding the conductive member and separated from the conductive member.

In some embodiments, a semiconductor package includes: a substrate including a conductive pad; a semiconductor device including a conductive member; and a connection element between the conductive pad and the conductive member, wherein a neck portion is disposed between a joint of the conductive member and the connection element.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1A:
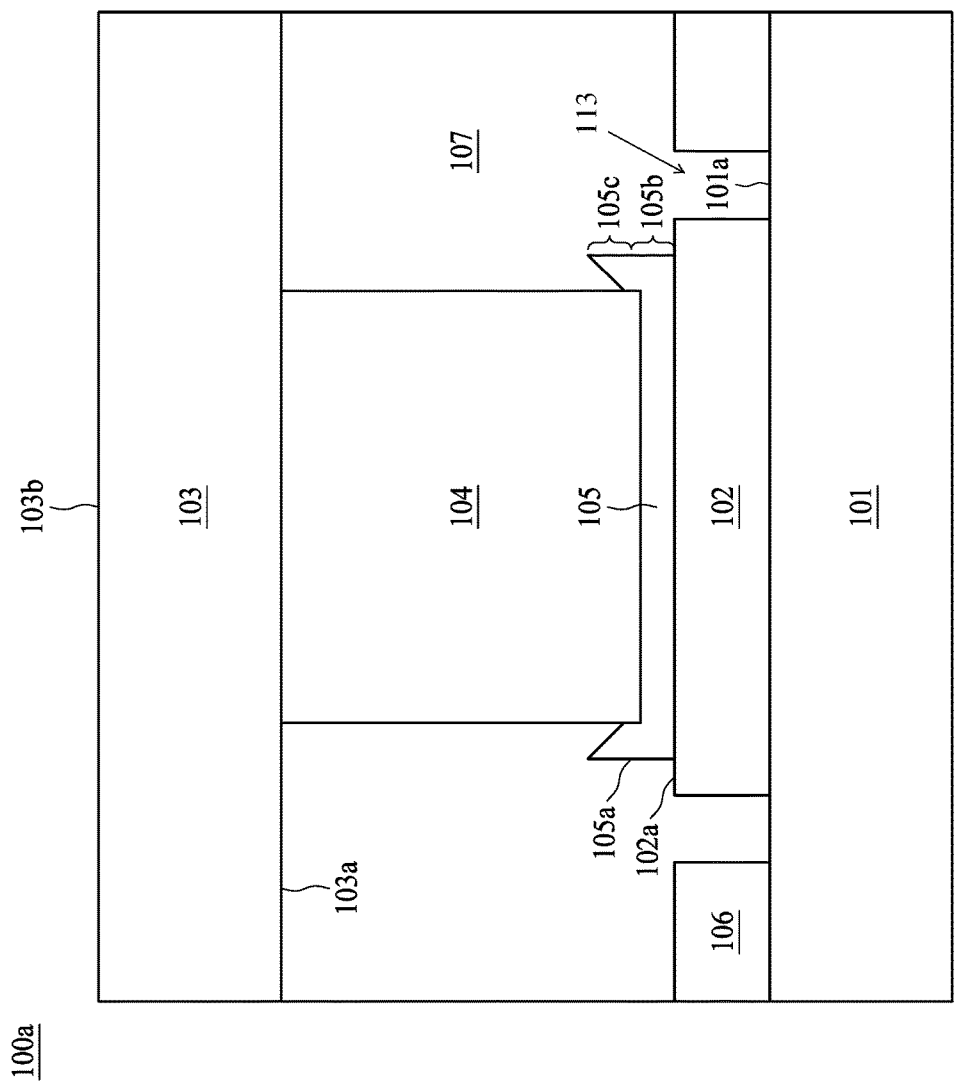
FIG. 1A is a cross-sectional view of a semiconductor package structure in accordance with some embodiments of the present disclosure.

Manufacturing and use of some embodiments of the present disclosure are discussed in detail below. It should be appreciated, however, that some embodiments set forth have many applicable inventive concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element or feature as illustrated in the Figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may be interpreted accordingly.

FIG. 1A is a cross-sectional view of a semiconductor package structure 100a in accordance with some embodiments of the present disclosure. The semiconductor package structure 100a includes a substrate 101. A conductive pad (e.g., copper bond pad) 102 is provided or disposed on a surface 101a of the substrate 101. The semiconductor package structure 100a also includes a semiconductor device (e.g., semiconductor chip) 103. The semiconductor device 103 includes a conductive member (e.g., copper pillar or solder ball) 104. The conductive member 104 extends from a surface 103a of the semiconductor device 103 toward the substrate 101. A connection element 105 is provided or disposed between the conductive pad 102 and the conductive member 104. The conductive pad 102 and the conductive member 104 are electrically coupled together through the connection element 105. Specifically, the connection element 105 is coupled between one end of the conductive member 104 and a surface 102a of the conductive pad 102. The connection element 105 has a sidewall 105a. An angle between the sidewall 105a and the surface 102a of the conductive pad 102 is equal to or less than about 90 degrees. In other embodiments, the angle is less than about 90 degrees, such as about 88 degrees or less, about 85 degrees or less, or about 83 degrees or less. As shown in FIG. 1A, the angle is about 90 degrees. An insulating mask layer 106 is provided or disposed on the surface 101a of the substrate 101 to surround the conductive pad 102. The conductive pad 102 is separated from the insulating mask layer 106. For example, the conductive pad 102 may be separated from the insulating mask layer 106 by a trench 113. In some embodiments, the conductive pad 102 is not separated from the insulating mask layer 106.

The semiconductor package structure 100a is encapsulated in a molding compound (e.g., encapsulant) 107. In some embodiments, a top surface 103b of the semiconductor device 103 is exposed from the molding compound 107.

The semiconductor device 103 may be a semiconductor die having an active surface coupled to the conductive member 104, the conductive member 104 may be a copper pillar bump used in flip-chip interconnection to connect the semiconductor device 103 to the substrate 101, the connection element 105 may be a solder material, the conductive pad 102 may be a copper bond pad and the insulating mask layer 106 may be a solder mask/solder resist. The substrate 101 may include multi-layered substrates, gradient substrates, hybrid orientation substrates, any combinations thereof and/or the like. The materials for the substrate 101 include bulk silicon, a semiconductor wafer, a silicon-on-insulator (SOI) substrate, or a silicon germanium substrate.

As shown in FIG. 1A, the connection element 105 includes a base portion 105b and a protruding rim (or cup) portion 105c. The base portion 105b is directly provided or disposed on the surface 102a of the conductive pad 102. One end of the conductive member 104 directly contacts the base portion 105b. The rim portion 105c extends from the base portion 105b and surrounds the conductive member 104. The rim portion 105c is separated from the conductive member 104. The rim portion 105c and the conductive member 104 are separated by the molding compound 107. The rim portion 105c has a relatively thicker edge adjacent to the base portion 105b of the connection element 105.

Figure 1B:
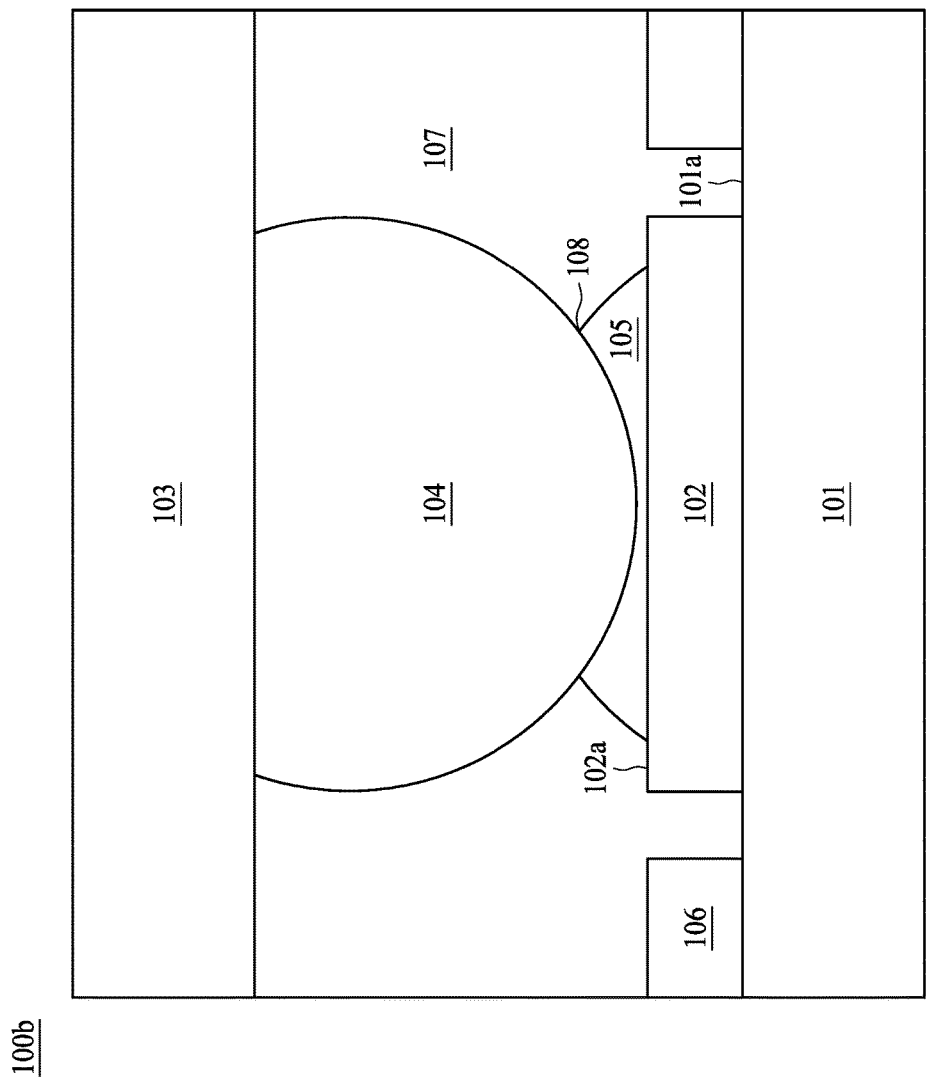
FIG. 1B is a cross-sectional view of a semiconductor package structure in accordance with some embodiments of the present disclosure.

FIG. 1B is a cross-sectional view of a semiconductor package structure 100b in accordance with some embodiments of the present disclosure. The semiconductor package structure 100b includes a conductive member 104 that is formed from a solder ball. A neck portion 108 is formed or disposed at a joint (e.g., interface) of (e.g., between) the conductive member 104 and the connection element 105. In some embodiments, the connection element 105 includes a solder material.

Figure 2:
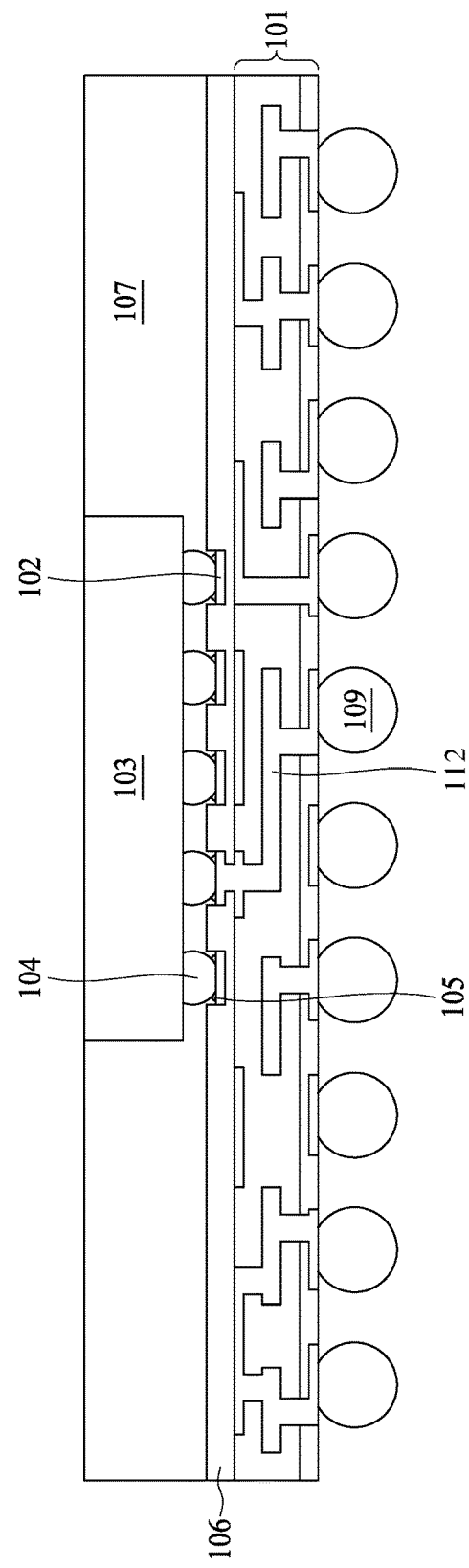
FIG. 2 is a cross-sectional view of a semiconductor package structure in accordance with some embodiments of the present disclosure.

FIG. 2 is a cross-sectional view of a semiconductor package structure 200 in accordance with some embodiments (e.g., the semiconductor package structure 200 is similar to the semiconductor package structure 100b of FIG. 1B). The semiconductor package structure 200 includes interconnections 112 disposed within the substrate 101. The interconnections 112 are used to electrically connect the conductive pad 102 to solder balls 109 that are used for electric connection to external elements.

Figure 3:
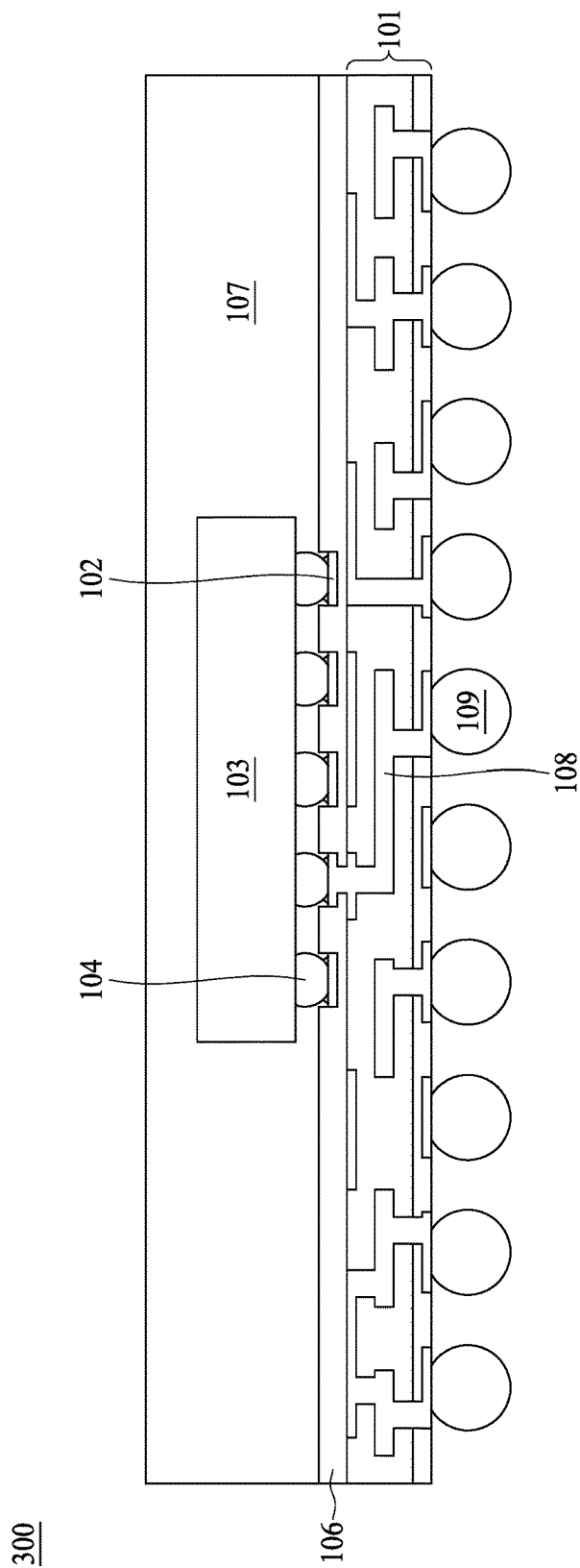
FIG. 3 is a cross-sectional view of a semiconductor package structure in accordance with some embodiments of the present disclosure.

FIG. 3 is a cross-sectional view of a semiconductor package structure 300 in accordance with some embodiments of the present disclosure. The semiconductor package structure 300 is encapsulated in a molding compound 107, wherein the top surface of the semiconductor device 103 is not exposed from the molding compound 107.

Figure 4:
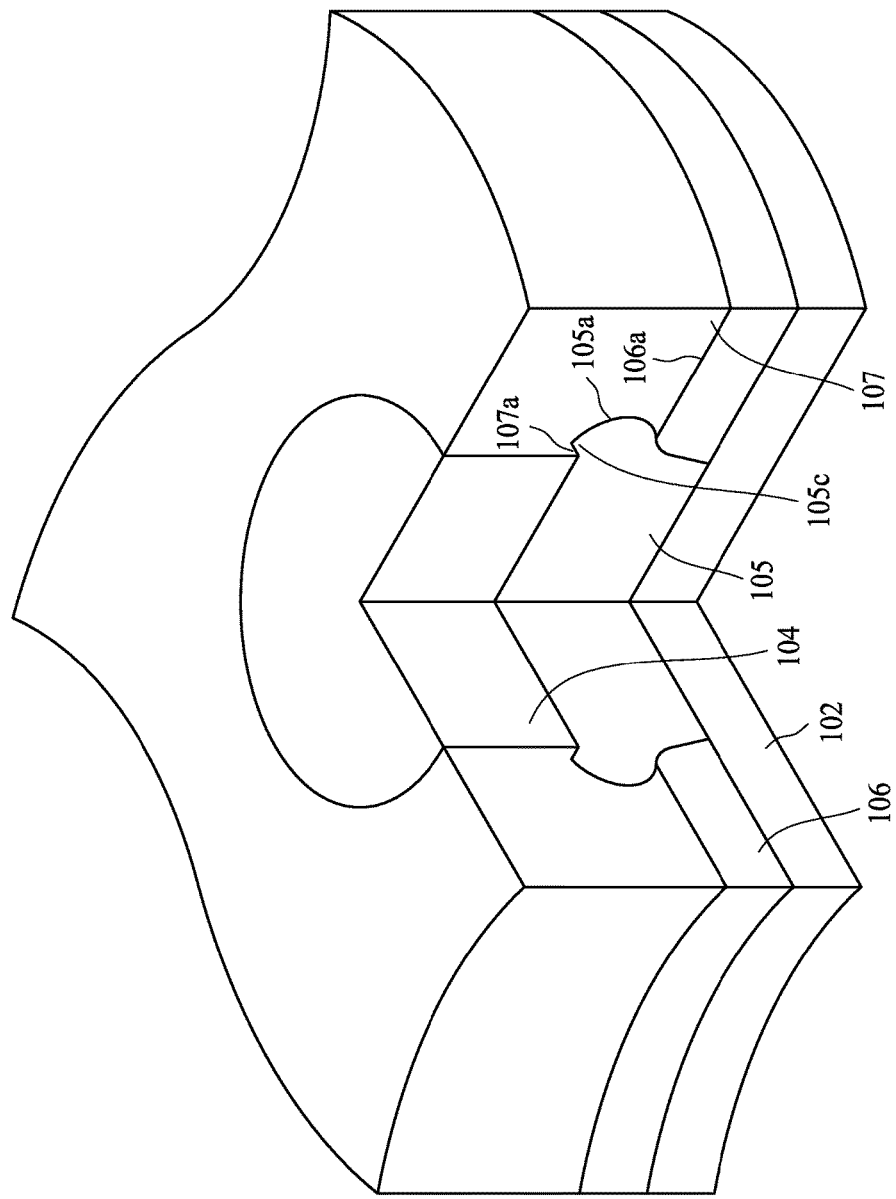
FIG. 4 is a three-dimensional (3D) illustration of a semiconductor package structure in accordance with some embodiments of the present disclosure.

FIG. 4 is a three-dimensional (3D) illustration of a semiconductor package structure 400 in accordance with some embodiments of the present disclosure. The semiconductor package structure 400 includes a substrate 101, a conductive pad 102, a semiconductor device 103 (not shown), a conductive member 104, a connection element 105, an insulating mask layer 106 and a molding compound 107. As shown in FIG. 4, the insulating mask layer 106 surrounds and is in direct contact with the connection element 105, and the conductive pad 102 is not separated from the insulating mask layer 106, which indicates a solder mask defined (SMD) configuration. An angle between the sidewall 105a of the connection element 105 and the top surface 106a of the insulating mask layer 106 is equal to or less than about 90 degrees. The connection element 105 includes a protruding rim portion 105c. The rim portion 105c of the connection element 105 and the conductive member 104 are separated by a portion 107a of the molding compound 107.

Figure 5:
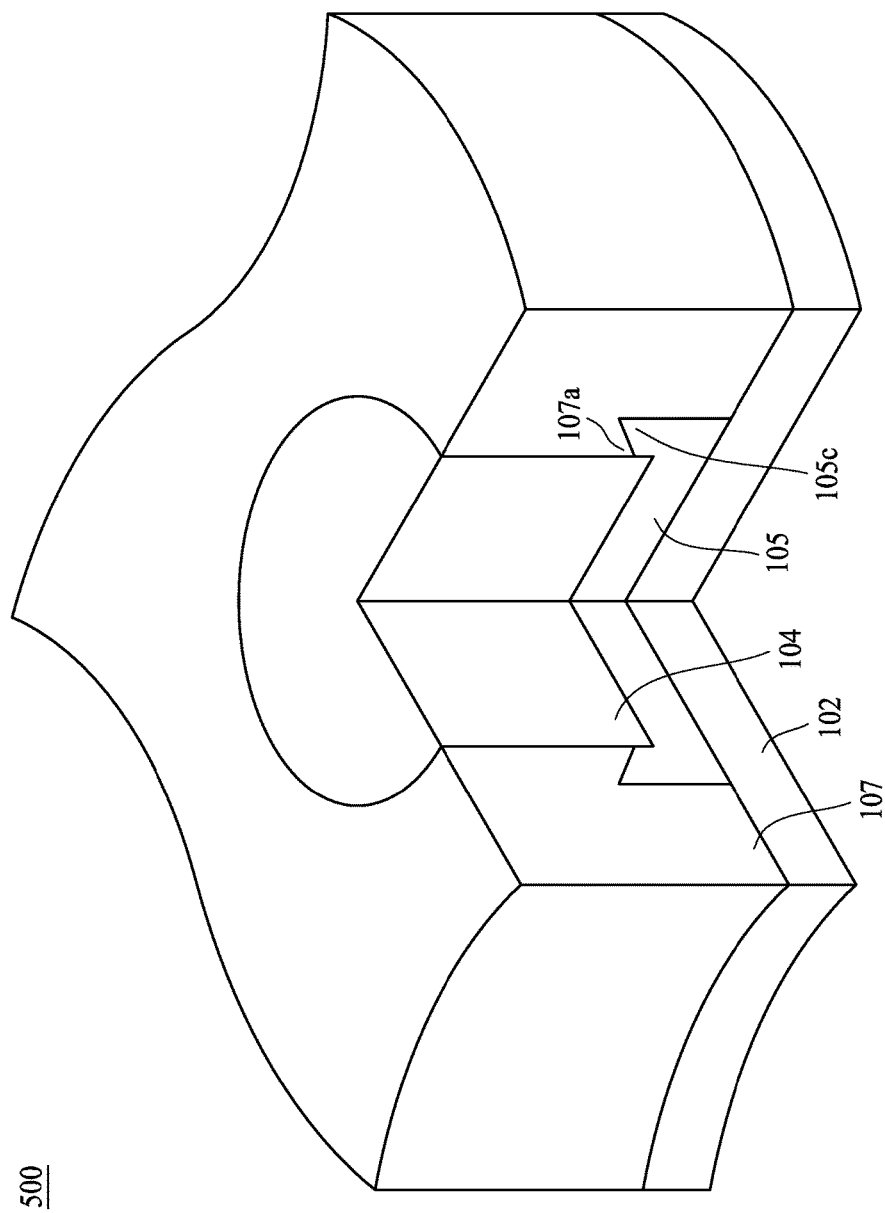
FIG. 5 is a 3D illustration of a semiconductor package structure in accordance with some embodiments of the present disclosure.

FIG. 5 is a 3D illustration of a semiconductor package structure 500 in accordance with some embodiments of the present disclosure. As shown in FIG. 5, the conductive pad 102 is separated from the insulating mask layer 106 (not shown), which indicates a non-solder mask defined (NSMD) configuration. An angle between the sidewall of the connection element 105 and the top surface of the conductive pad 102 is equal to or smaller than about 90 degrees. A rim portion 105c of the connection element 105 and the conductive member 104 are separated by a portion 107a of the molding compound 107.

FIGS. 6A-6F schematically illustrate operations for a method of manufacturing a semiconductor package in accordance with some embodiments of the present disclosure.

Figure 6A:
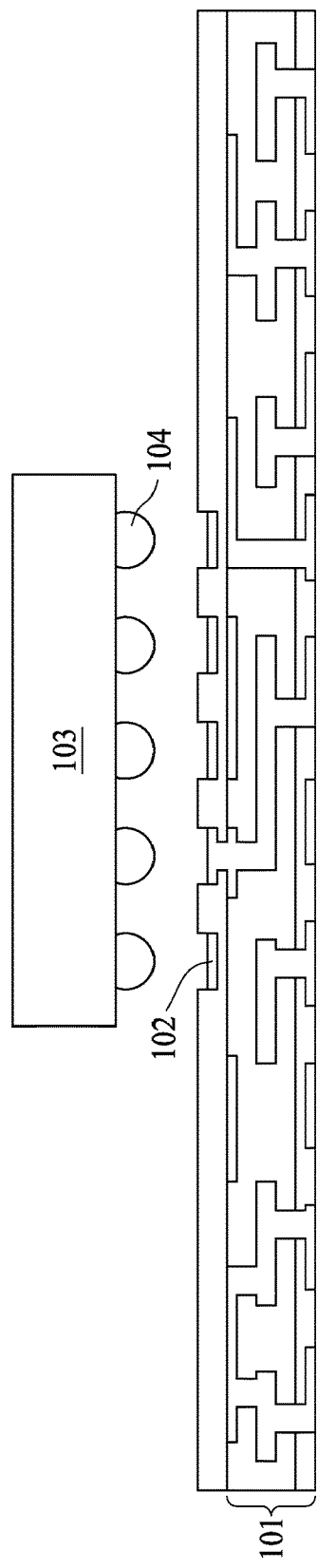
FIG. 6A, FIG. 6B, FIG. 6C, FIG. 6D, FIG. 6E, and FIG. 6F schematically illustrate operations for a method of manufacturing a semiconductor package in accordance with some embodiments of the present disclosure.

In FIG. 6A, a substrate 101 including copper bond pads 102 is provided. A semiconductor chip 103 including solder balls 104 is placed on the substrate 101 to form a package assembly. Specifically, each solder ball 104 of the semiconductor chip 103 is placed on a corresponding copper bond pad 102. The solder balls 104 are dipped in advance with a solder flux (not shown), which facilitates soldering by removing oxidation from the solder balls 104.

Figure 6B:
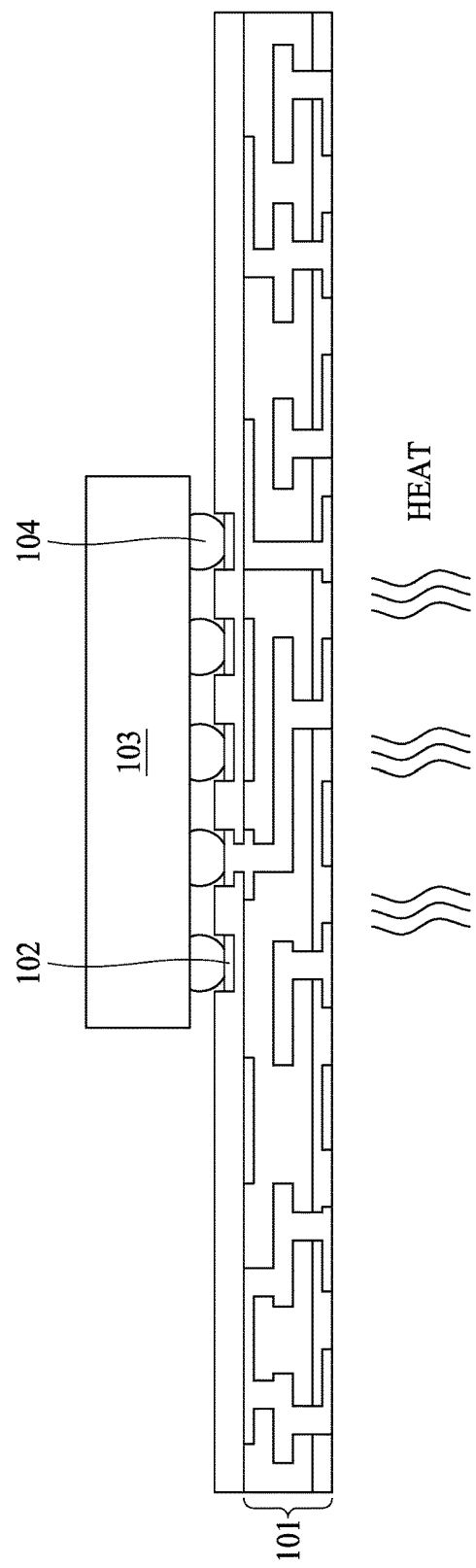

In FIG. 6B, a reflow process is performed on the solder balls 104 at a controlled temperature (which may be up to about 240 to about 250 degrees Celsius). The reflow process is performed by passing the assembly through a reflow oven (not shown), which may be a forced convection reflow oven or a vapor phase oven. The assembly is heated by the reflow oven within a reflow soldering thermal profile (which can be further divided into the preheat, thermal soak, reflow, and cooling stages). The goal of the reflow process is to melt the solder balls 104 and to heat the copper bond pads 102. Due to the relatively higher temperature for performing the reflow process, an intermetallic compound (IMC) layer is formed or disposed at the interface between the solder ball 104 and the copper bond pad 102.

Figure 6C:
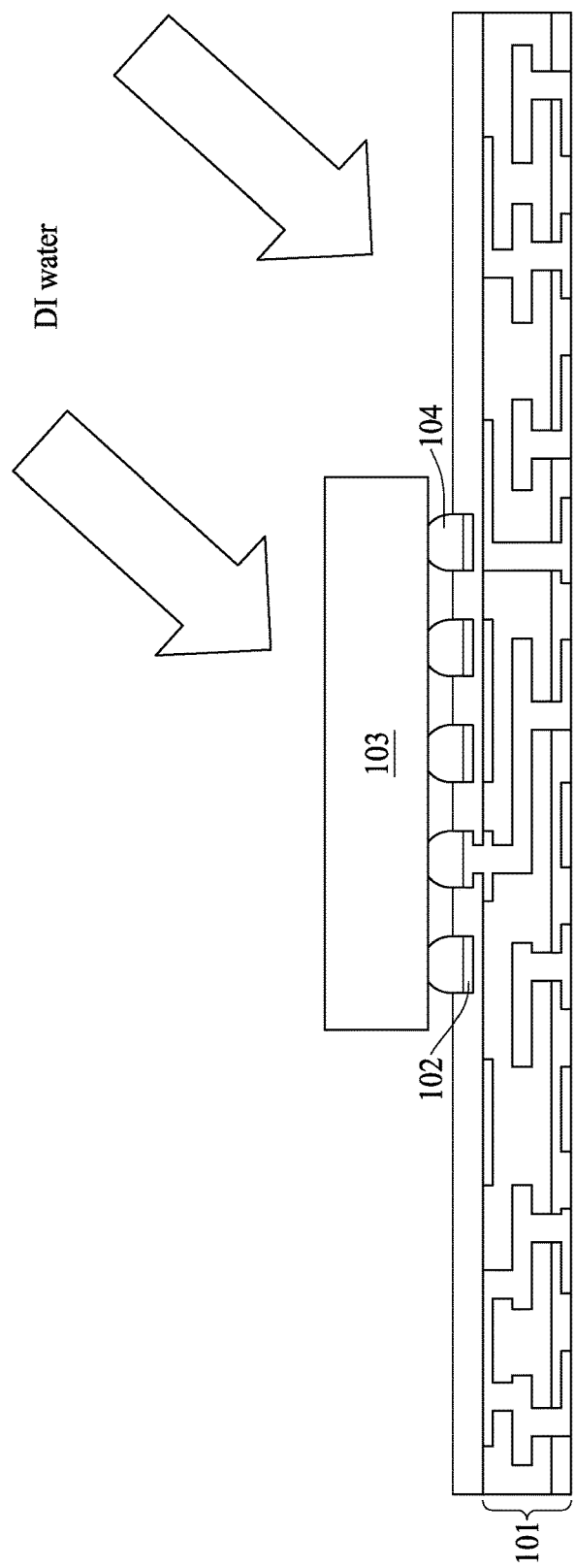

In FIG. 6C, deionized (DI) water is used to clean the residual flux left within the assembly.

Figure 6D:
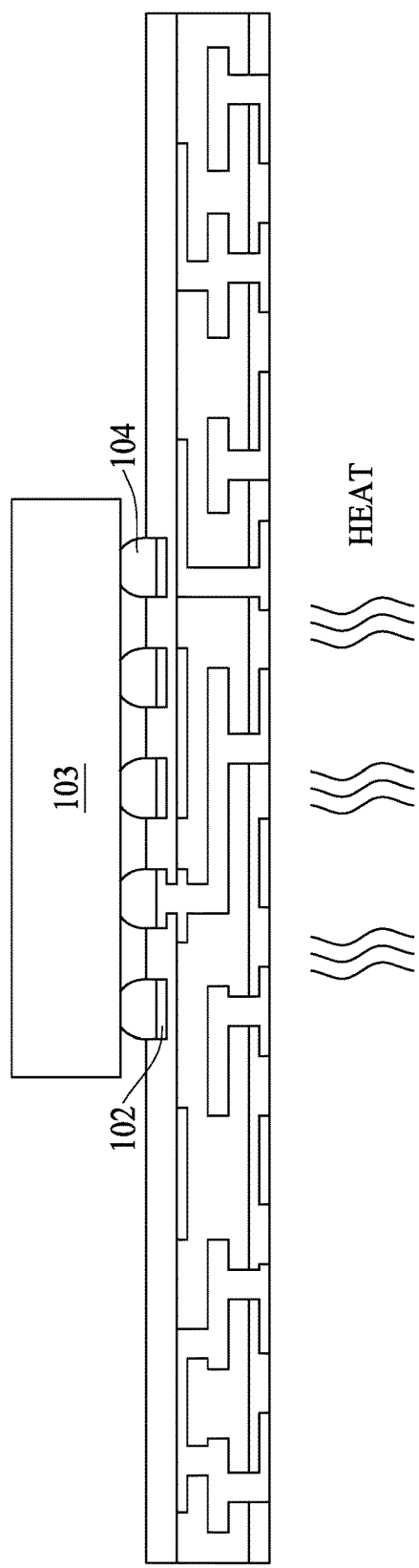

In FIG. 6D, a baking process is performed to prevent or reduce moisture (e.g., the DI water left within the assembly) from accumulating within the assembly. Moisture within the assembly may result in unwanted voids in the semiconductor package during manufacturing operations.

Figure 6E:
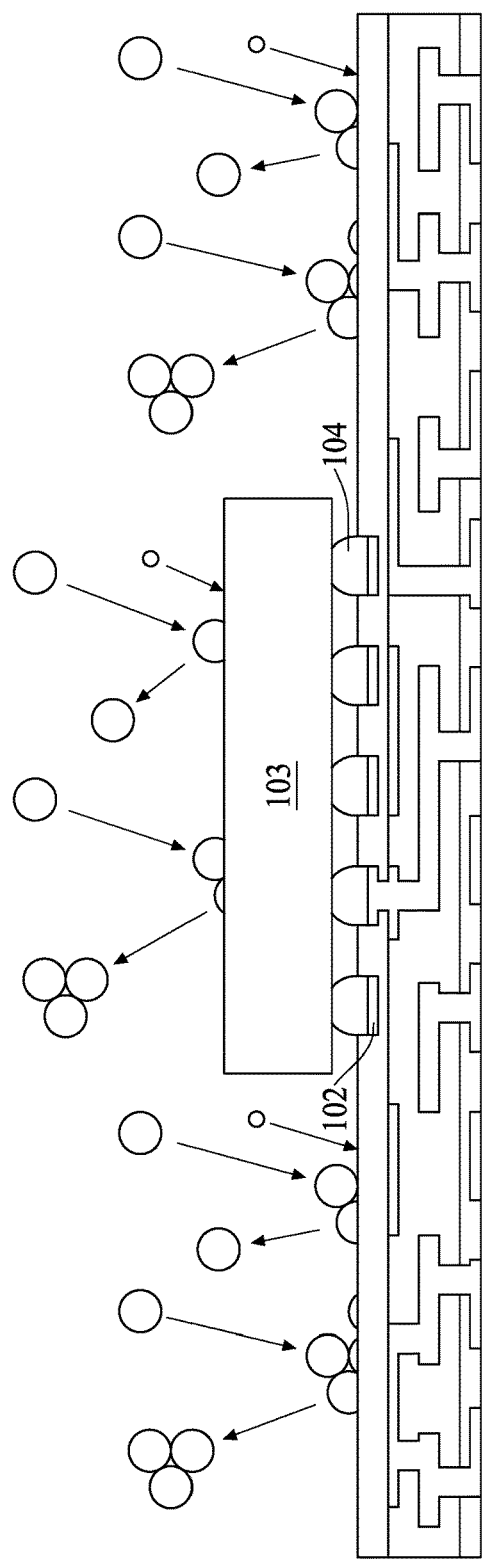

In FIG. 6E, a plasma cleaning process is performed to remove impurities and contaminants from surfaces of the assembly through the use of an energetic plasma or dielectric barrier discharge (DBD) plasma. The plasma cleaning process also enhances adhesion and bonding to other surfaces and helps prepare the surfaces of the assembly for subsequent processing.

Figure 6F:
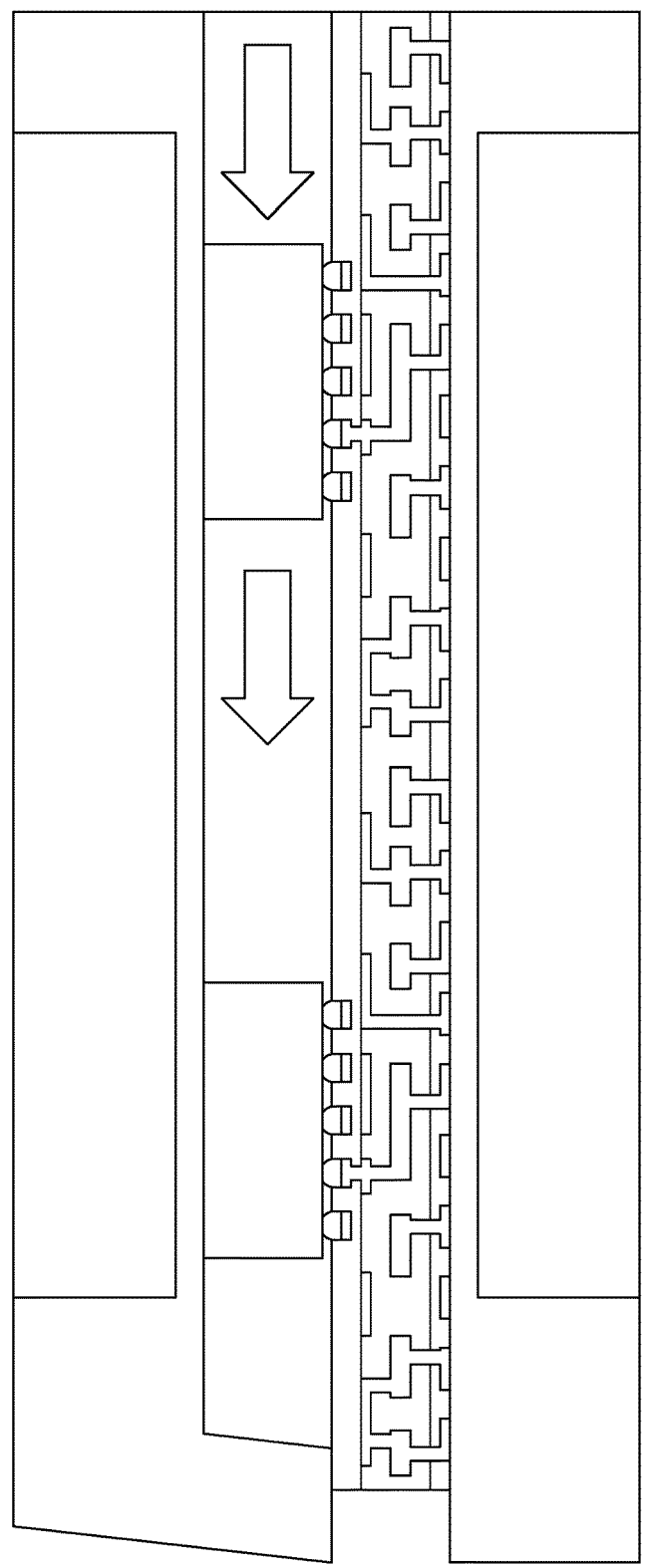

In FIG. 6F, a molding process is performed to encapsulate the assembly with a molding compound. The molding process may include transfer molding and compression molding. During the molding process, the assembly is placed within a mold cavity. The mold cavity is defined by a top mold chase and a bottom mold chase. The molding compound is forced into the mold cavity to encapsulate the assembly. Specifically, the top and bottom mold chases are preheated to a temperature around 160 degrees Celsius to facilitate the melting of the molding compound. The molding compound is then cooled and cured, and the top and bottom mold chases are removed.

Figure 7A:
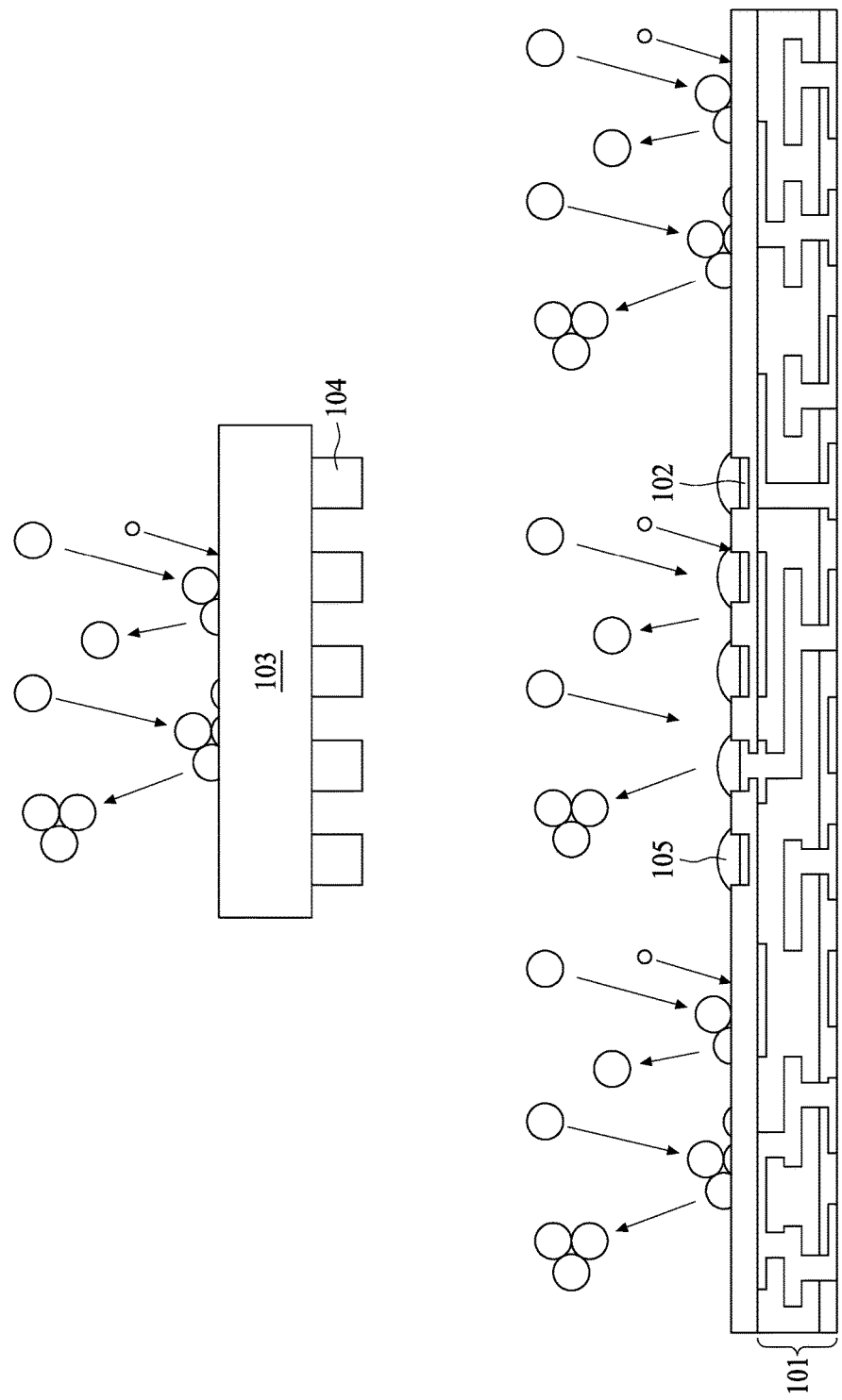
FIG. 7A, FIG. 7B, and FIG. 7C schematically illustrate operations for a method of manufacturing a semiconductor package in accordance with some embodiments of the present disclosure.
Figure 7B:
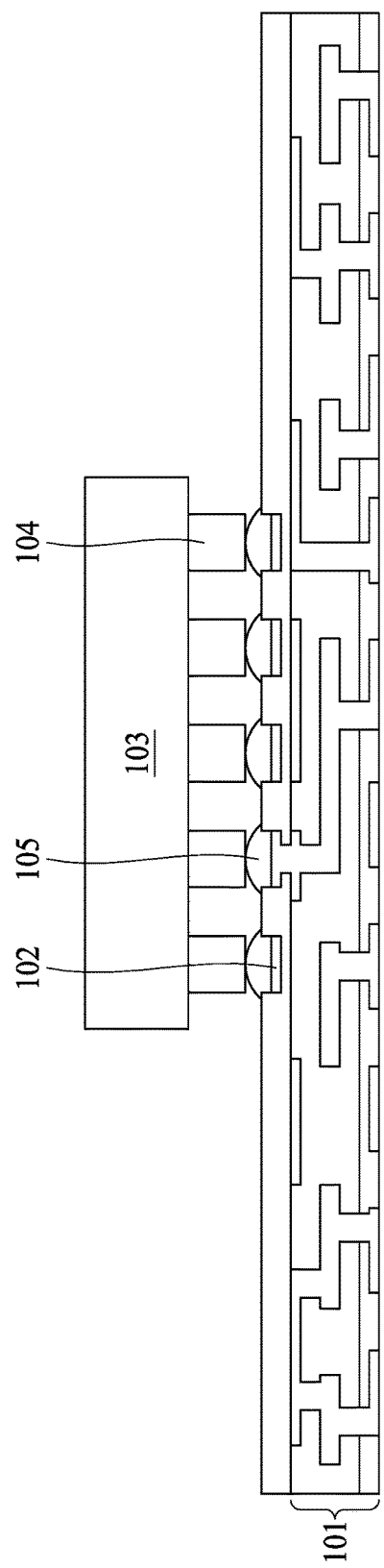
Figure 7C:
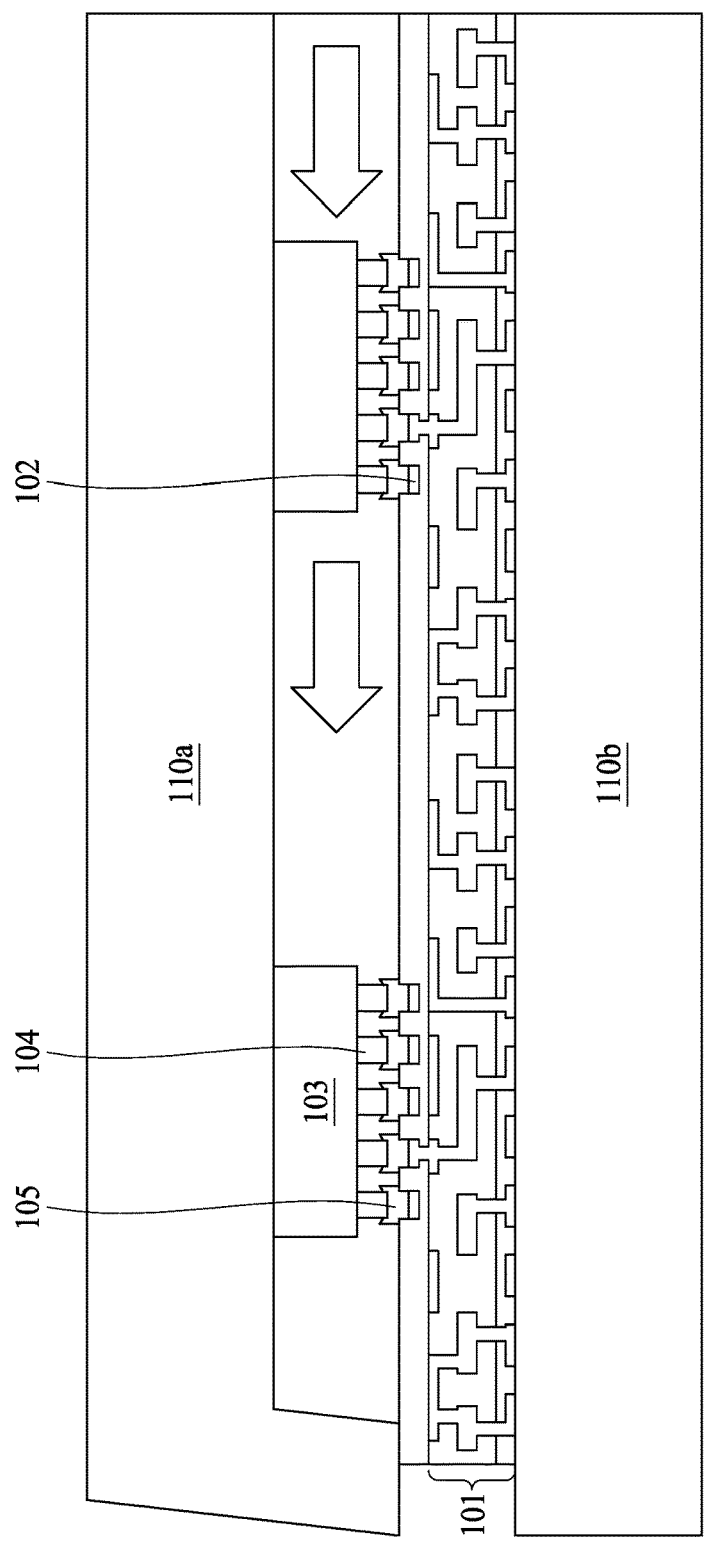

FIGS. 7A-7C schematically illustrate operations for a method of manufacturing a semiconductor package in accordance with some embodiments of the present disclosure.

In FIG. 7A, a plasma cleaning process is performed on the substrate 101 and on the semiconductor chip 103 separately so as to remove impurities and contaminants from all surfaces of the substrate 101 and the semiconductor chip 103 and to enhance adhesion and bonding of these surfaces to other surfaces. For the substrate 101, a connection element 105 is provided or disposed on each conductive pad 102 of the substrate 101.

In FIG. 7B, the semiconductor chip 103 is coupled to the substrate 101, wherein each conductive member 104 of the semiconductor chip 103 is placed on a corresponding connection element 105 provided or disposed on each conductive pad 102 of the substrate 101.

In FIG. 7C, a molding process is performed to encapsulate the assembly of the substrate 101 and the semiconductor chip 103 with a molding compound. As shown in FIG. 7C, the assembly is clamped between a top mold chase 110a and a bottom mold chase 110b, wherein the top mold chase 110a is in direct contact with a top surface of the semiconductor chip 103. The molding process is performed at a temperature around 160 degrees Celsius and under a predetermined pressure. During the molding process, an additional downward pressing force is applied from the top mold chase 110a directly to the semiconductor chip 103, making the conductive member 104 to slightly penetrate into the connection element 105 of the substrate 101. The downward pressing force from the top mold chase 110a causes partial melting of the connection element 105, which causes the close bonding of the conductive member 104 to the connection element 105.

In some embodiments, the bonding of the conductive member 104 to the connection element 105 mainly results from the downward pressing force from the top mold chase 110a, and thus a reflow process may be omitted. Since the temperature for the molding process is less than that for a reflow process, in some embodiments, a thinner layer of IMC (not shown) would be provided, as compared with that created from a reflow process, at the interface between the conductive member 104 and the connection element 105, which would reduce the risk of cracking at the interface.

Figure 8A:
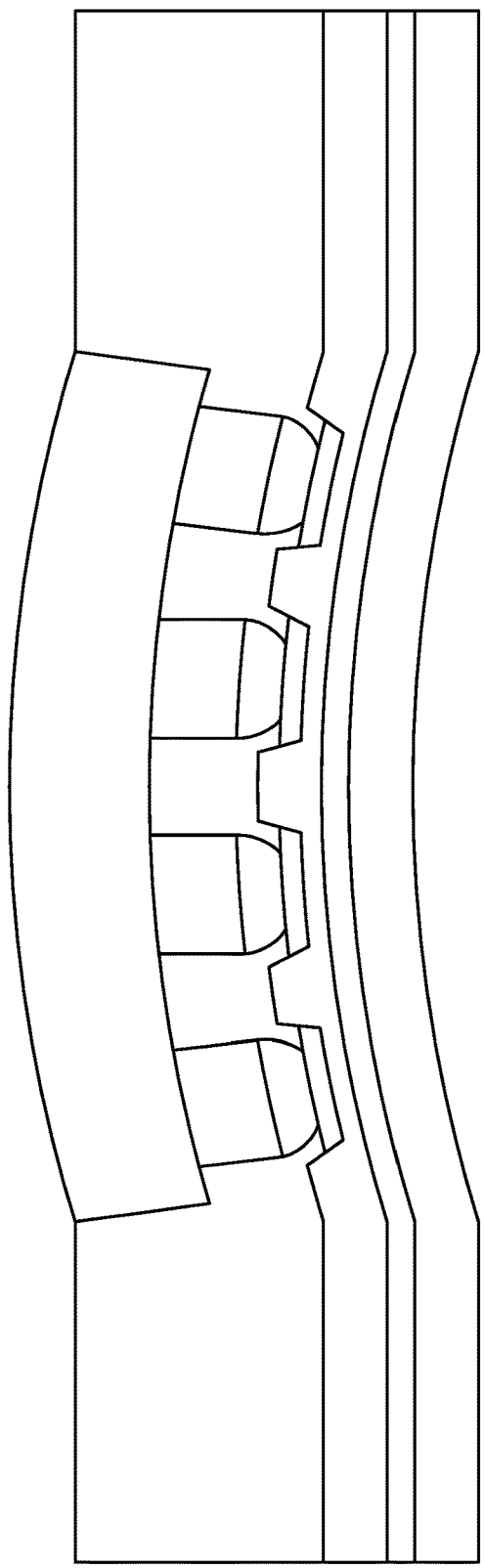
FIG. 8A is a cross-sectional view of a semiconductor package structure in accordance with some embodiments of the present disclosure.
Figure 8B:
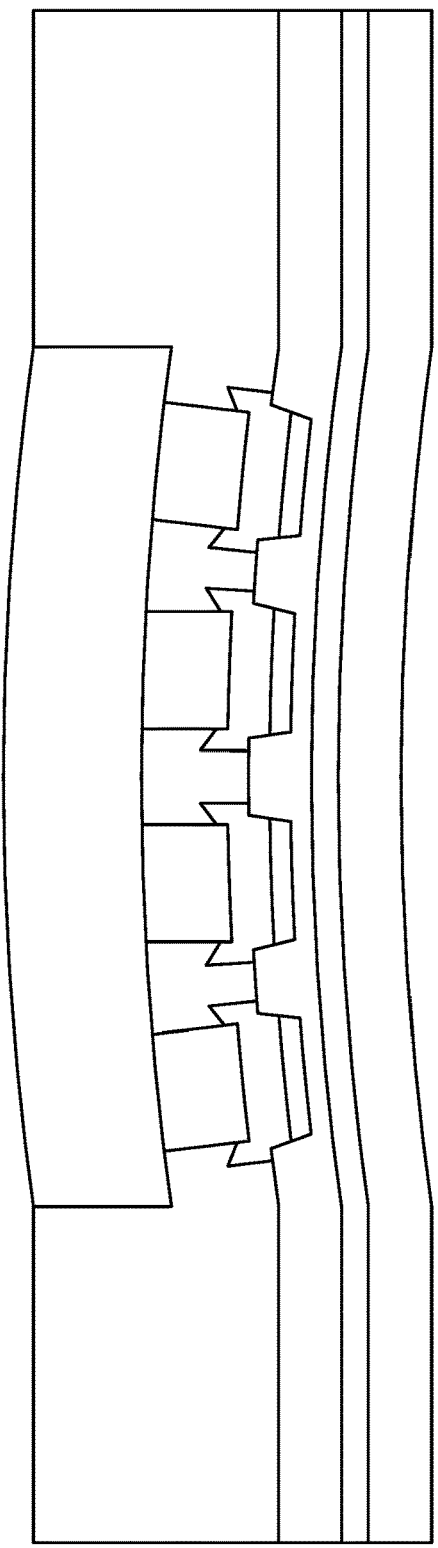
FIG. 8B is a cross-sectional view of a semiconductor package structure in accordance with some embodiments of the present disclosure.

FIG. 8A shows a semiconductor package manufactured in accordance with comparable processes including a reflow process, while FIG. 8B shows a semiconductor package manufactured in accordance with the method shown in FIGS. 7A-7C. FIG. 8A shows a relatively greater warpage of the semiconductor package due to several thermal cycle(s) during manufacturing processes including a reflow process. It is clear from FIG. 8B that warpage of the semiconductor package is mitigated because the reflow operation is eliminated in some embodiments (e.g., FIGS. 7A-7C).

Figure 9:
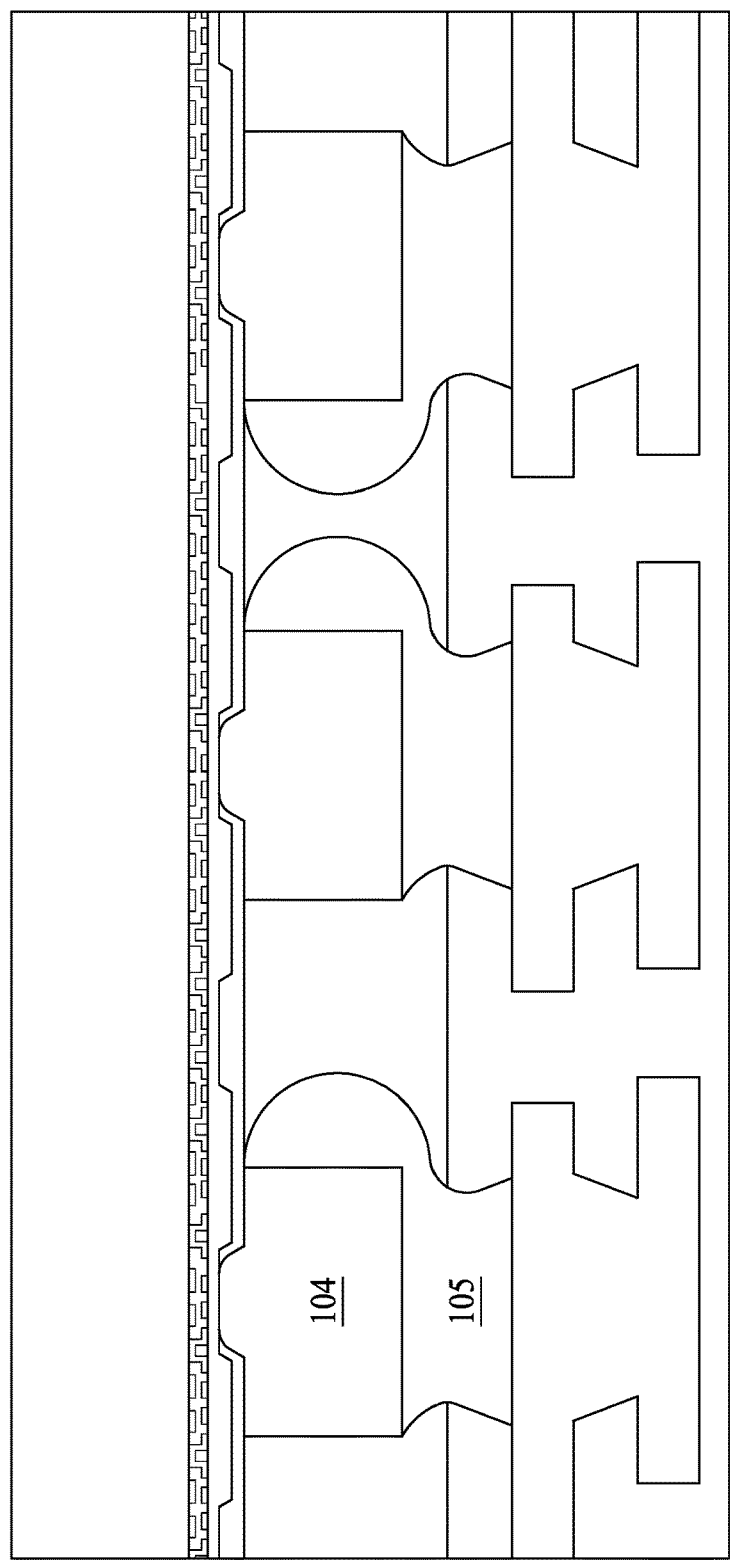
FIG. 9 shows a semiconductor package having issues created during a reflow process.

FIG. 9 shows a semiconductor package having issues created during a reflow process. After reflow, the connection element 105 may unevenly stick to one sidewall of the conductive member 104 (e.g., solder creeping issue), or the neighboring connection elements 105 may undesirably short together (e.g., bridging issue).

Figure 10A:
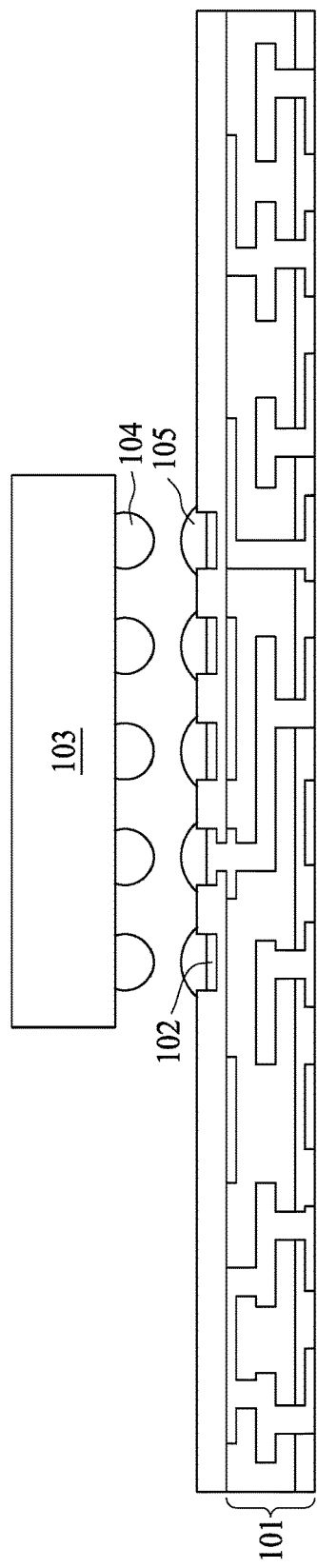
FIG. 10A, FIG. 10B, FIG. 10C, FIG. 10D, and FIG. 10E schematically illustrate operations for a method of manufacturing a semiconductor package in accordance with some embodiments of the present disclosure.
Figure 10B:
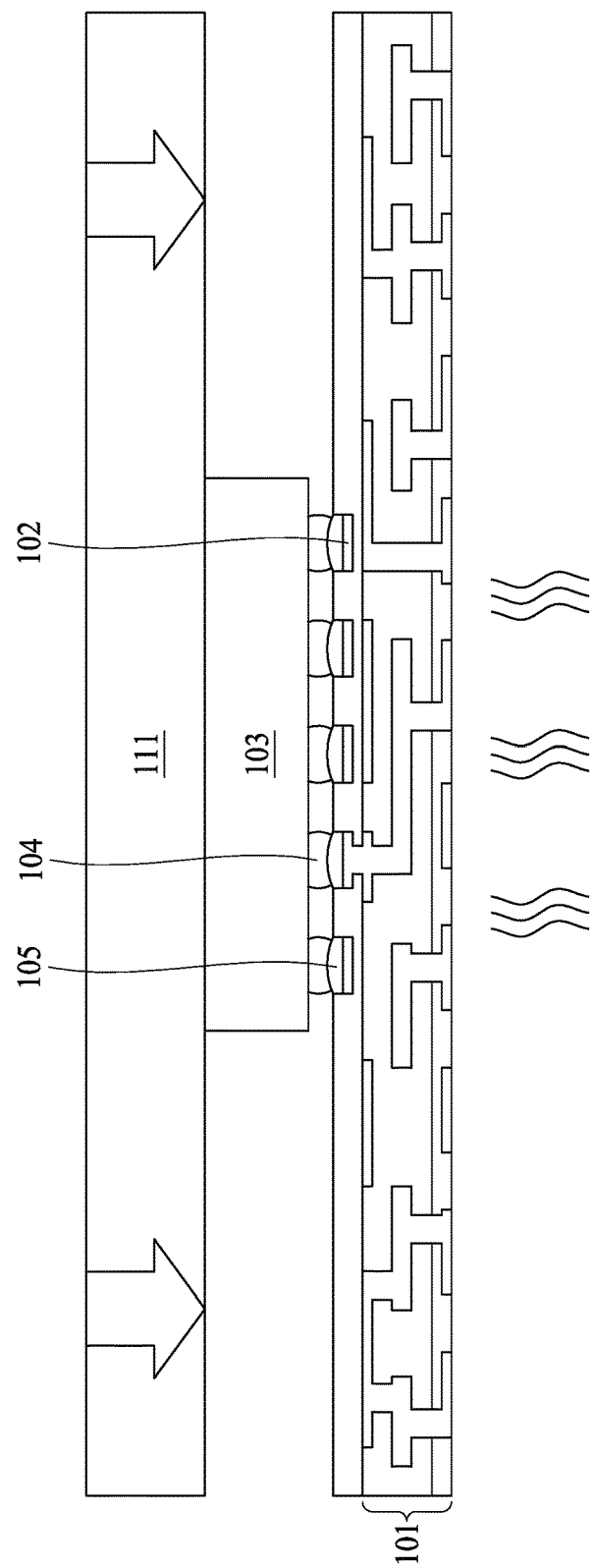
Figure 10C:
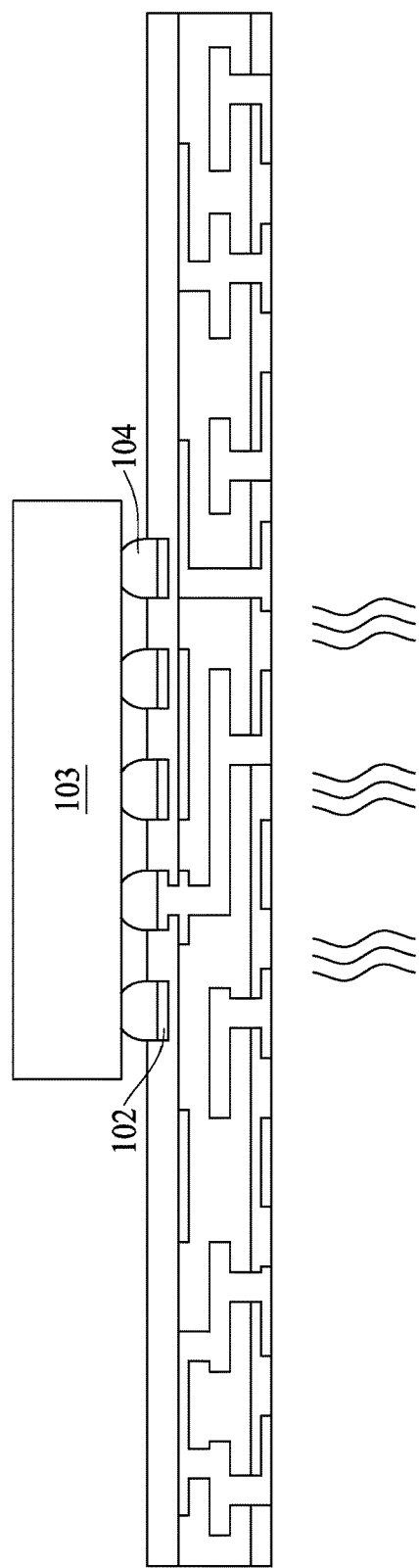
Figure 10D:
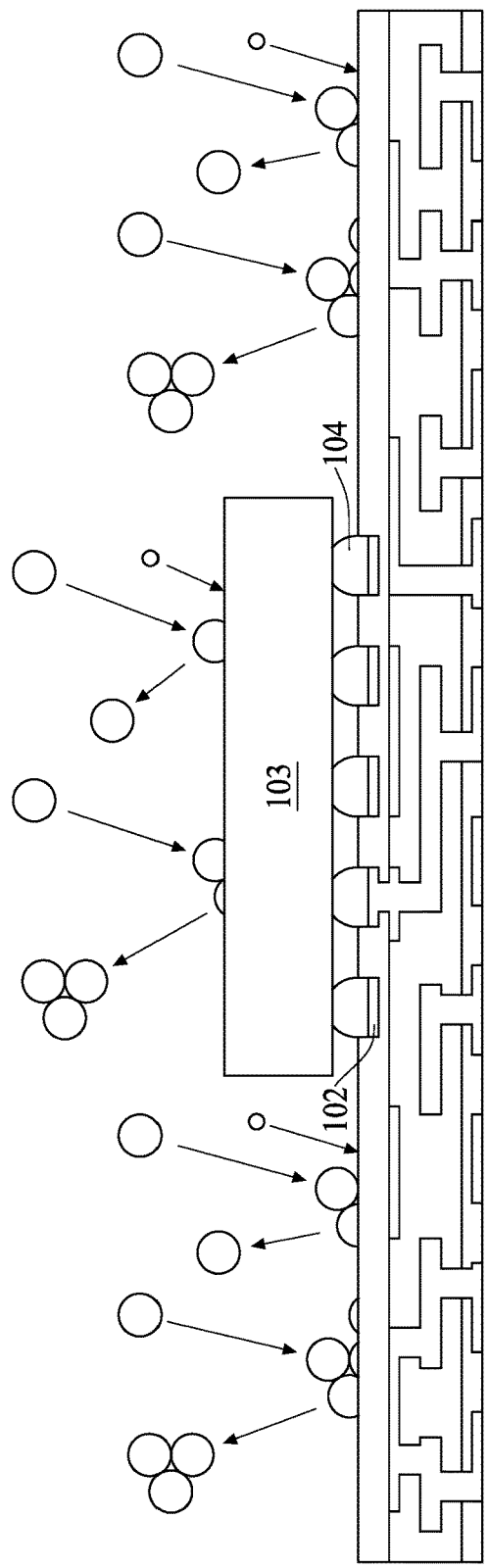
Figure 10E:
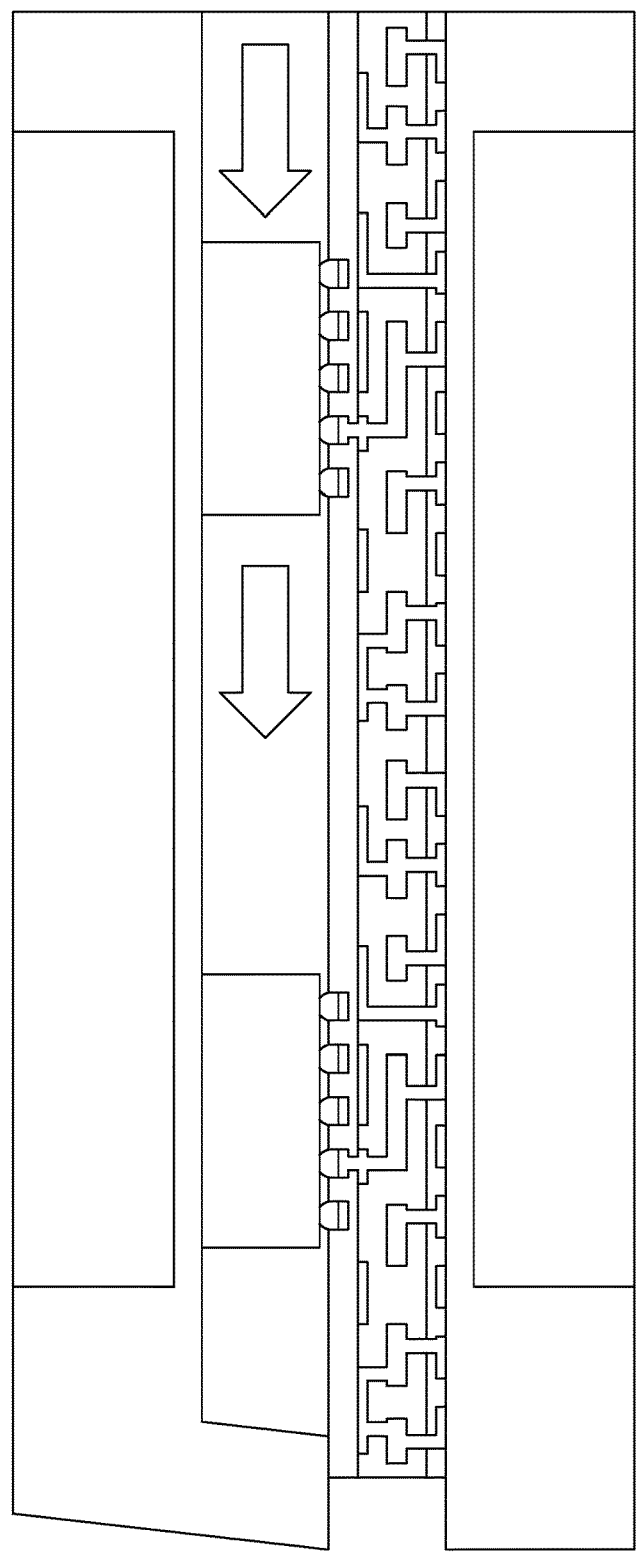

FIGS. 10A-10E schematically illustrate operations for a method of manufacturing a semiconductor package in accordance with some embodiments of the present disclosure. In FIG. 10A, a substrate 101 including copper bond pads 102 and a semiconductor chip 103 including solder balls 104 are provided. A connection element 105 is provided or disposed on each copper bond pad 102. In FIG. 10B, a heat clamper 111 is employed to provide a downward pressing force to the semiconductor chip 103, causing the close bonding of the conductive member 104 to the connection element 105. In FIG. 10C, a baking process is performed to prevent moisture from accumulating within the semiconductor package. In FIG. 10D, a plasma cleaning process is performed to remove impurities and contaminants from surfaces and to enhance adhesion and bonding to other surfaces. In FIG. 10E, a molding process is performed to encapsulate the semiconductor package with a molding compound.

Figure 11A:
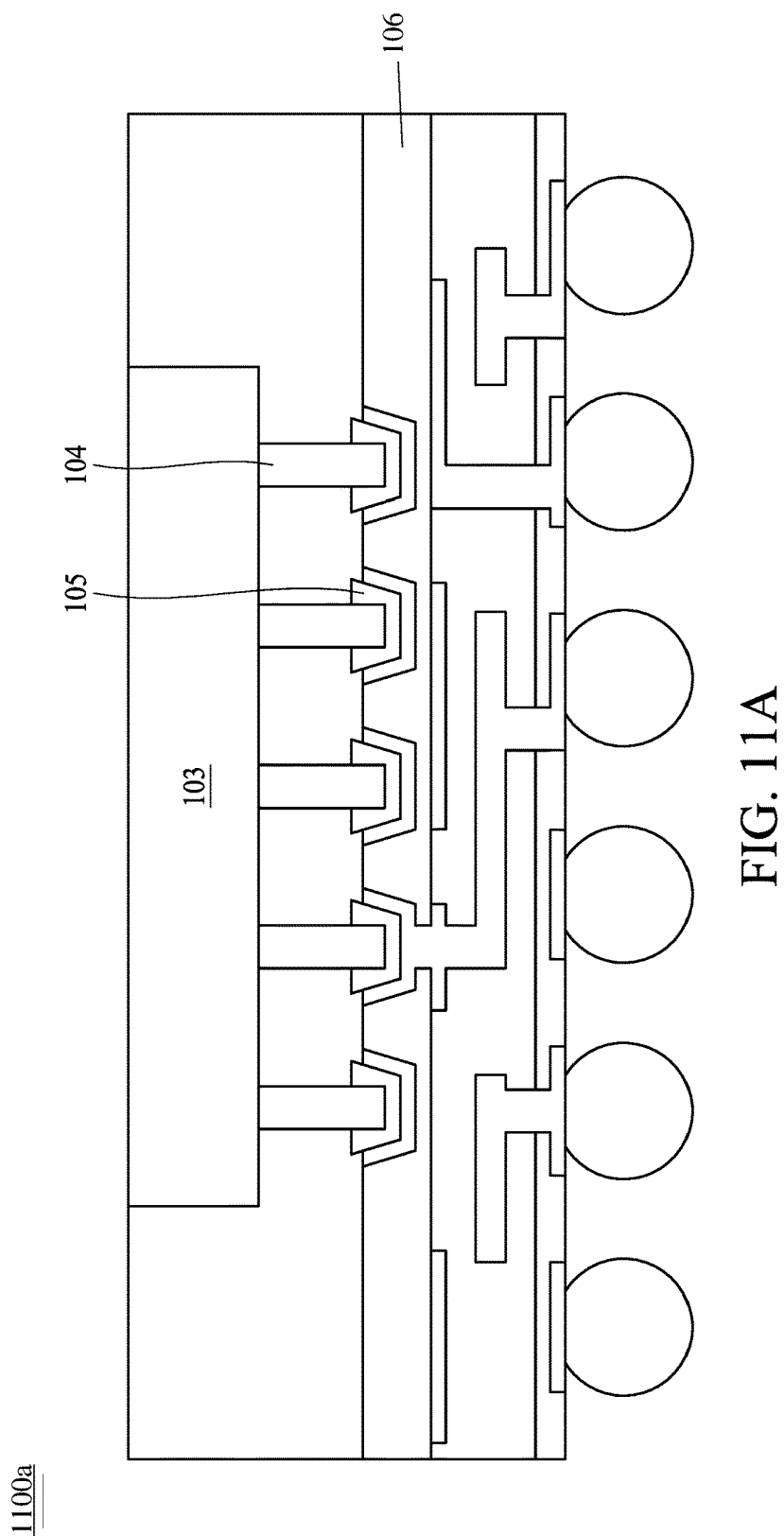
FIG. 11A is a cross-sectional view of a semiconductor package structure in accordance with some embodiments of the present disclosure.

FIG. 11A is a cross-sectional view of a semiconductor package structure 1100a in accordance with some embodiments of the present disclosure. In FIG. 11A, the connection element 105 is formed as a solder paste surrounded by the insulating layer 106 and is coupled to the conductive member 104.

Figure 11B:
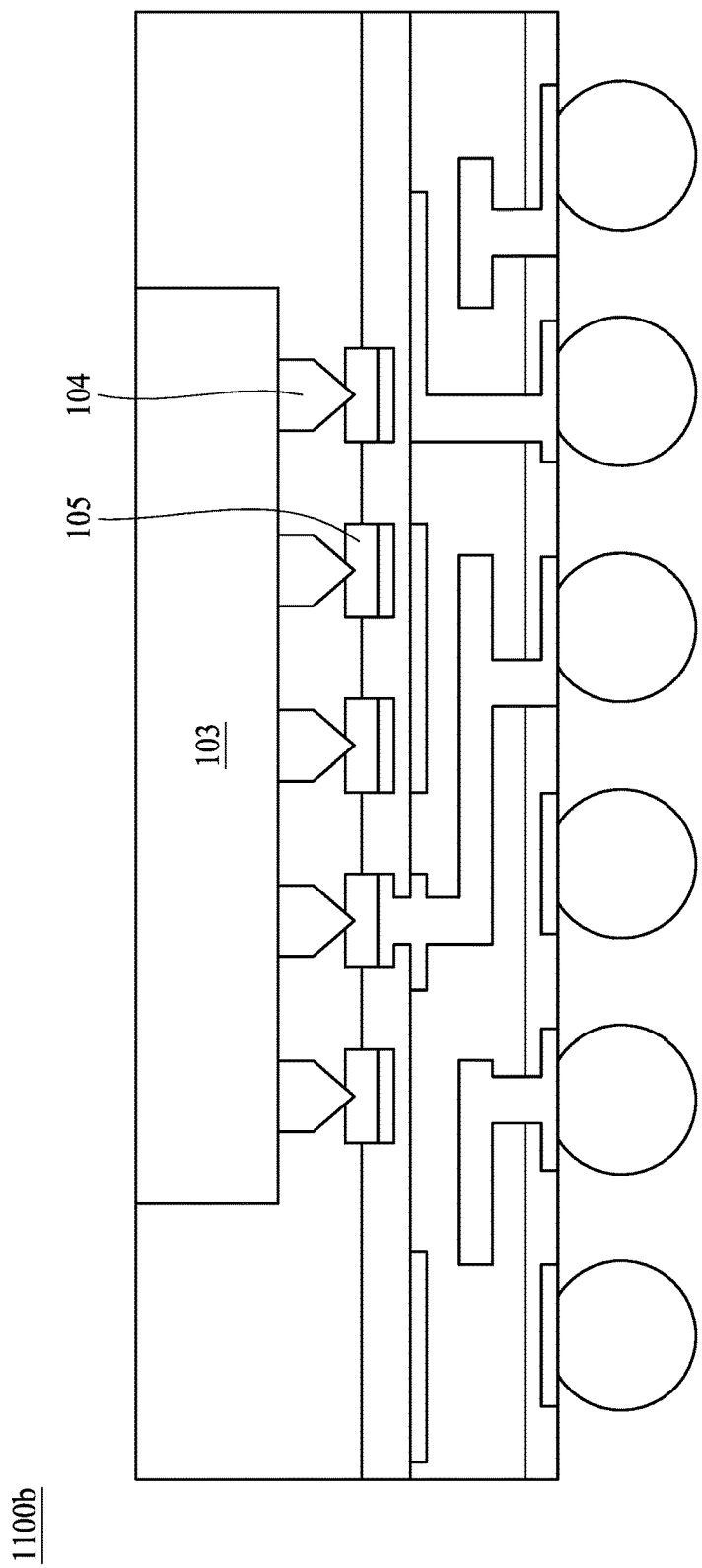
FIG. 11B is a cross-sectional view of a semiconductor package structure in accordance with some embodiments of the present disclosure.

FIG. 11B is a cross-sectional view of a semiconductor package structure 1100b in accordance with some embodiments of the present disclosure. In FIG. 11B, the conductive member 104 is formed as a gold stud bump with a pointed protrusion that penetrates into the connection element 105.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
   a substrate including a conductive pad, the conductive pad having a first surface;
   a semiconductor device including a conductive member;
   a connection element between the first surface of the conductive pad and the conductive member, the connection element including a rim portion; and
   an encapsulant,
   wherein a first portion of the first surface of the conductive pad is covered by the connection element, and a second portion of the first surface of the conductive pad is exposed from the conductive element,
   the connection element has a sidewall, and an angle of the sidewall relative to the second portion of the first surface of the conductive pad is equal to or less than about 90 degrees, and
   at least a portion of the rim portion and the conductive member are separated by the encapsulant.

2. The semiconductor package according to claim 1, wherein the conductive member comprises a copper pillar.

3. The semiconductor package according to claim 1, wherein a neck portion is disposed at a joint between the conductive member and the connection element.

4. The semiconductor package according to claim 1, wherein the conductive member comprises a solder material.

5. The semiconductor package according to claim 1, wherein the connection element comprises a solder material.

6. The semiconductor package according to claim 1, further comprising an insulating layer surrounding the conductive pad.

7. The semiconductor package according to claim 6, wherein the conductive pad is separated from the insulating layer.

8. A semiconductor package, comprising:
a substrate including a conductive pad, the conductive pad having a first surface;
a semiconductor device including a conductive member;
a connection element between the first surface of the conductive pad and the conductive member; and
an encapsulant;
wherein a first portion of the first surface of the conductive pad is covered by the connection element, and a second portion of the first surface of the conductive pad is exposed by the connection element,
the connection element includes a rim portion surrounding the conductive member and separated from the conductive member, and
at least a portion of the rim portion and the conductive member are separated by the encapsulant.

9. The semiconductor package according to claim 8, wherein the connection element further comprises a base portion under the rim portion.

10. The semiconductor package according to claim 9, wherein the conductive member contacts the base portion of the connection element.

11. The semiconductor package according to claim 10, wherein the rim portion has a relatively thicker edge adjacent to the base portion of the connection element.

12. The semiconductor package according to claim 8, wherein a surface of the semiconductor device is exposed from the encapsulant.

13. The semiconductor package according to claim 8, wherein an angle of a sidewall of the connection element relative to the conductive pad is equal to or less than about 90 degrees.

14. A semiconductor package, comprising:
a substrate including a conductive pad;
a semiconductor device including a conductive member;
an encapsulant filling a space between the substrate and the semiconductor device; and
a connection element between the conductive pad and the conductive member, the connection element including a rim portion,
wherein a neck portion is disposed at a joint between the conductive member and the connection element, and
at least a portion of the rim portion and the conductive member are separated by the encapsulant.

15. The semiconductor package according to claim 14, wherein the conductive member comprises a solder material.

16. The semiconductor package according to claim 14, wherein the connection element comprises a solder material.

17. The semiconductor package according to claim 14, further comprising an insulating layer surrounding the conductive pad.

18. The semiconductor package according to claim 17, wherein the conductive pad is separated from the insulating layer by a trench.

19. The semiconductor package according to claim 14, wherein the encapsulant is disposed over the conductive member and the connection element.

* * * * *